United States Patent
Reber et al.

(10) Patent No.: US 11,694,970 B2
(45) Date of Patent: Jul. 4, 2023

(54) PLATED PILLAR DIES HAVING INTEGRATED ELECTROMAGNETIC SHIELD LAYERS

(71) Applicant: NXP B.V., Eindhoven (NL)

(72) Inventors: Douglas Michael Reber, Austin, TX (US); Rishi Bhooshan, Greater Noida (IN)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 17/207,022

(22) Filed: Mar. 19, 2021

(65) Prior Publication Data
US 2022/0302042 A1  Sep. 22, 2022

(51) Int. Cl.
| | | |
|---|---|---|
| *H01L 23/552* | (2006.01) | |
| *H01L 21/78* | (2006.01) | |
| *H01L 23/00* | (2006.01) | |
| *H01L 23/58* | (2006.01) | |

(52) U.S. Cl.
CPC ............ *H01L 23/552* (2013.01); *H01L 21/78* (2013.01); *H01L 23/562* (2013.01); *H01L 23/585* (2013.01); *H01L 24/11* (2013.01); *H01L 24/13* (2013.01); *H01L 2224/11462* (2013.01); *H01L 2224/11614* (2013.01); *H01L 2224/13147* (2013.01); *H01L 2924/1306* (2013.01);
(Continued)

(58) Field of Classification Search
CPC ..... H01L 23/552; H01L 21/78; H01L 23/562; H01L 23/585; H01L 24/11; H01L 24/13; H01L 2224/11462; H01L 2224/11614; H01L 2224/13147; H01L 2924/1306; H01L 2924/14253; H01L 2924/3025; H01L 2924/3512
See application file for complete search history.

(56) References Cited

U.S. PATENT DOCUMENTS

| | | |
|---|---|---|
| 5,151,769 A | 9/1992 | Immorlica, Jr. et al. |
| 7,151,011 B2 | 12/2006 | Sridharan et al. |
| 7,642,128 B1 | 1/2010 | Lin et al. |

(Continued)

OTHER PUBLICATIONS

Atotech, Production of Uniform Dimension Copper Pillars for Flip Chip CSP, IMAPS 9th International Conference & Exhibition on Device Packaging Presentation, Scottsdale, AZ, Mar. 2013. (34 pages).

(Continued)

*Primary Examiner* — Thanh T Nguyen

(57) ABSTRACT

Wafer processing techniques, or methods for forming semiconductor rides, are disclosed for fabricating plated pillar dies having die-level electromagnetic interference (EMI) shield layers. In embodiments, the method includes depositing a metallic seed layer over a semiconductor wafer and contacting die pads thereon. An electroplating process is then performed to compile plated pillars on the metallic seed layer and across the semiconductor wafer. Following electroplating, selected regions of the metallic seed layer are removed to produce electrical isolation gaps around a first pillar type, while leaving intact portions of the metallic seed layer to yield a wafer-level EMI shield layer. The semiconductor wafer is separated into singulated plated pillar dies, each including a die-level EMI shield layer and plated pillars of the first pillar type electrically isolated from the EMI shield layer.

15 Claims, 9 Drawing Sheets

(52) U.S. Cl.
CPC ............ *H01L 2924/14253* (2013.01); *H01L 2924/3025* (2013.01); *H01L 2924/3512* (2013.01)

(56) References Cited

U.S. PATENT DOCUMENTS

| | | | |
|---|---|---|---|
| 7,948,064 B2 | 5/2011 | Barth et al. | |
| 8,058,960 B2 * | 11/2011 | Hebert | H01L 23/645 |
| | | | 336/200 |
| 8,169,059 B2 | 5/2012 | Barth et al. | |
| 8,853,834 B2 | 10/2014 | Fan et al. | |
| 10,211,167 B2 | 2/2019 | Stuber | |
| 2007/0090502 A1 | 4/2007 | Zhao et al. | |
| 2009/0315156 A1 | 12/2009 | Harper | |
| 2013/0147035 A1 | 6/2013 | Chen et al. | |
| 2018/0138132 A1 | 5/2018 | Nishizawa | |
| 2022/0173051 A1 * | 6/2022 | Chang Chien | H01L 23/552 |

OTHER PUBLICATIONS

Dupont, Ideas & Innovation—Copper Pillar Electroplating Tutorial, https://www.dupont.com/electronic-materials/blogs/knowledge/copper-pillar-electroplating-tutorial.html, © 2021 DuPont.

* cited by examiner

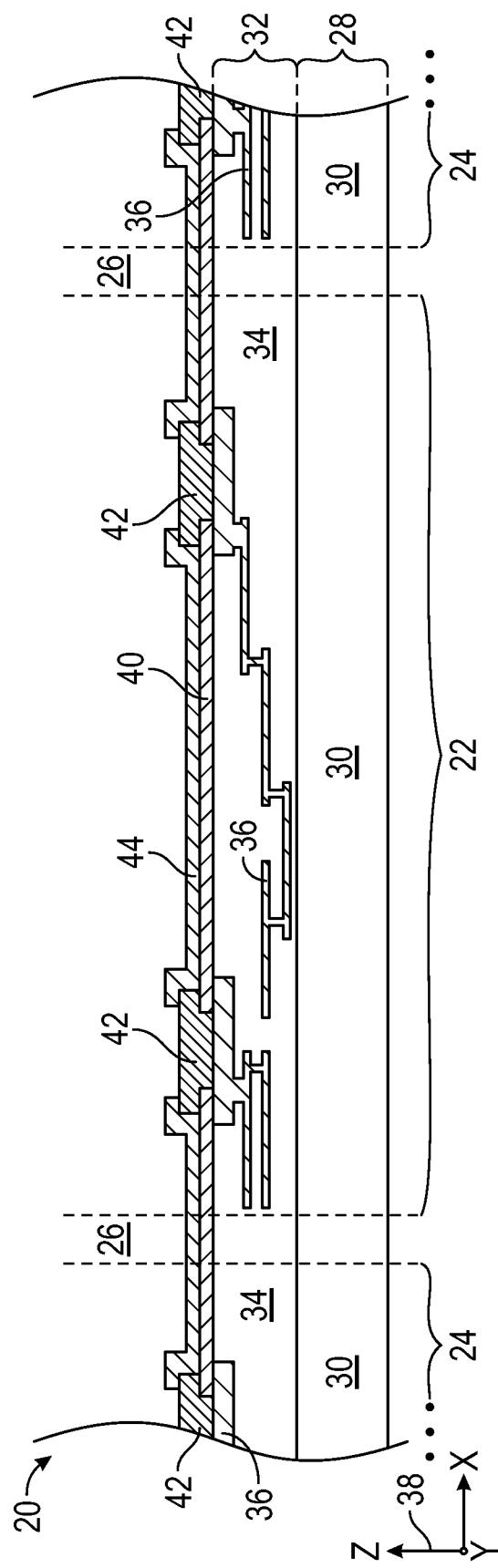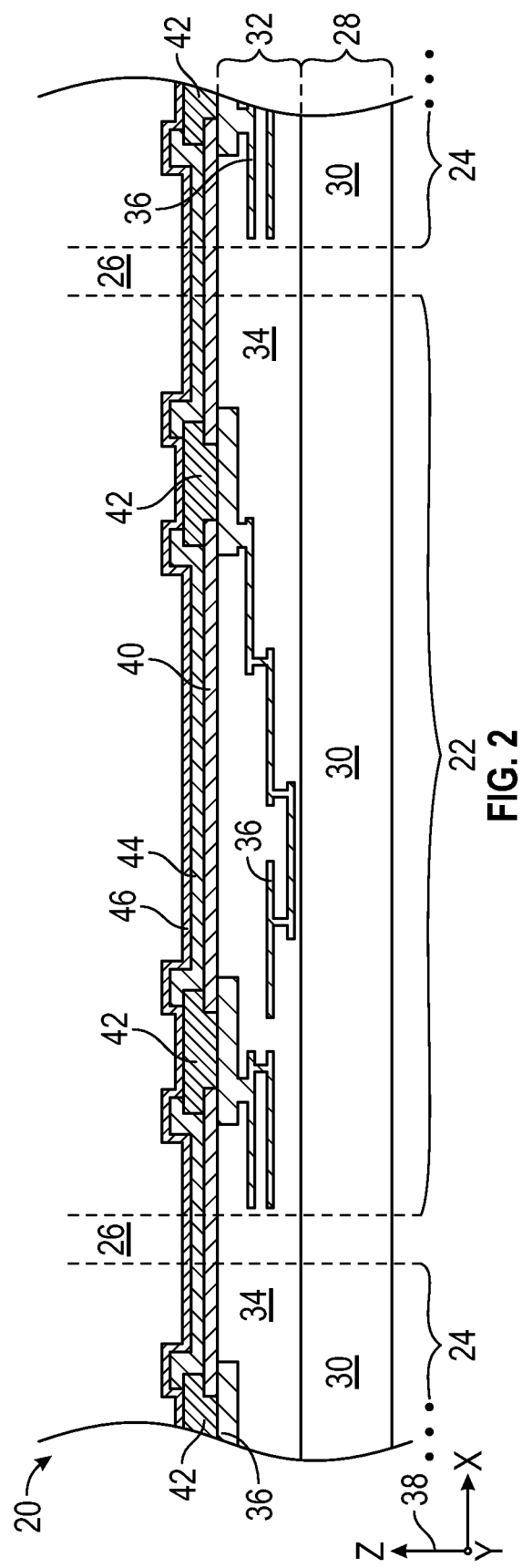

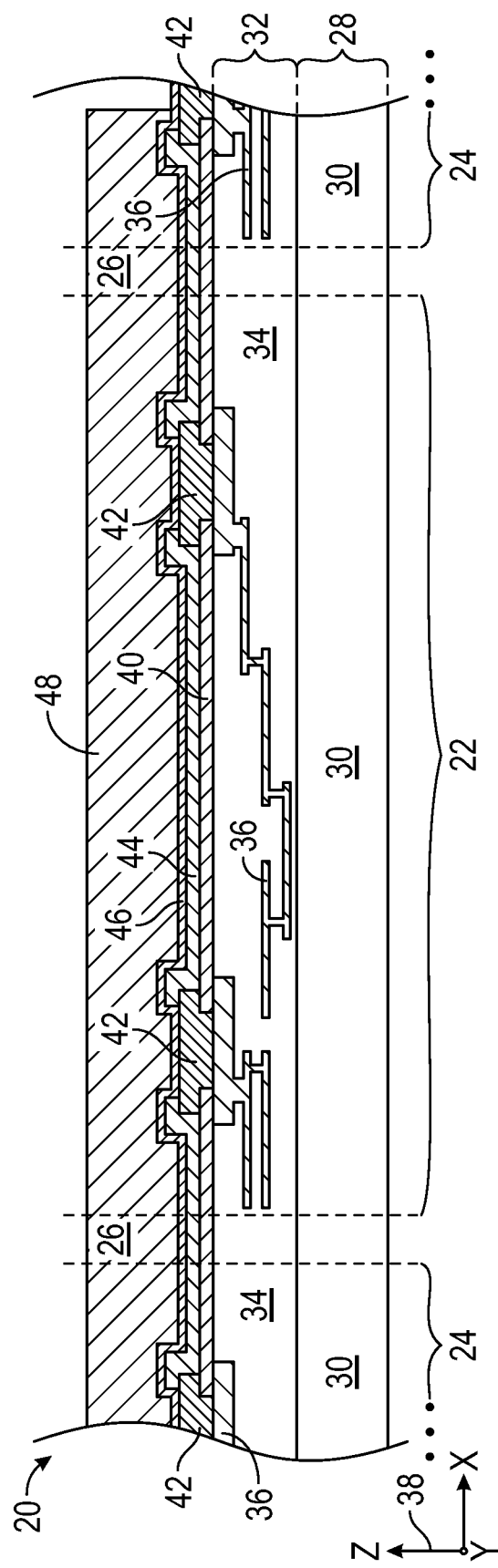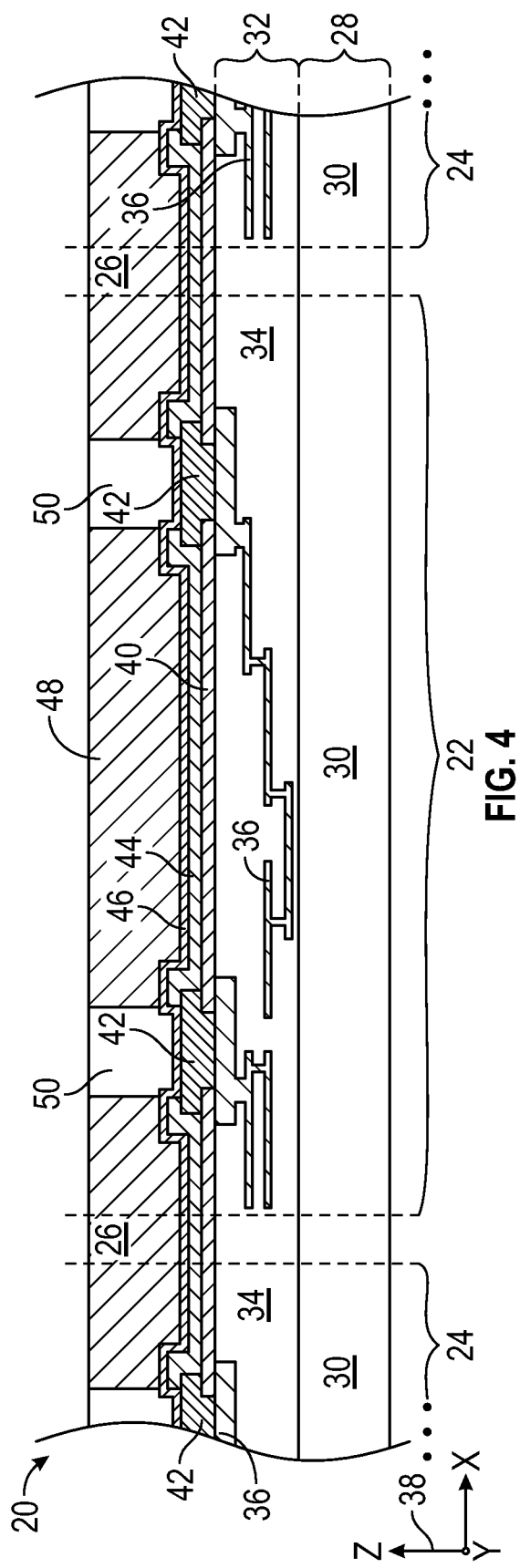

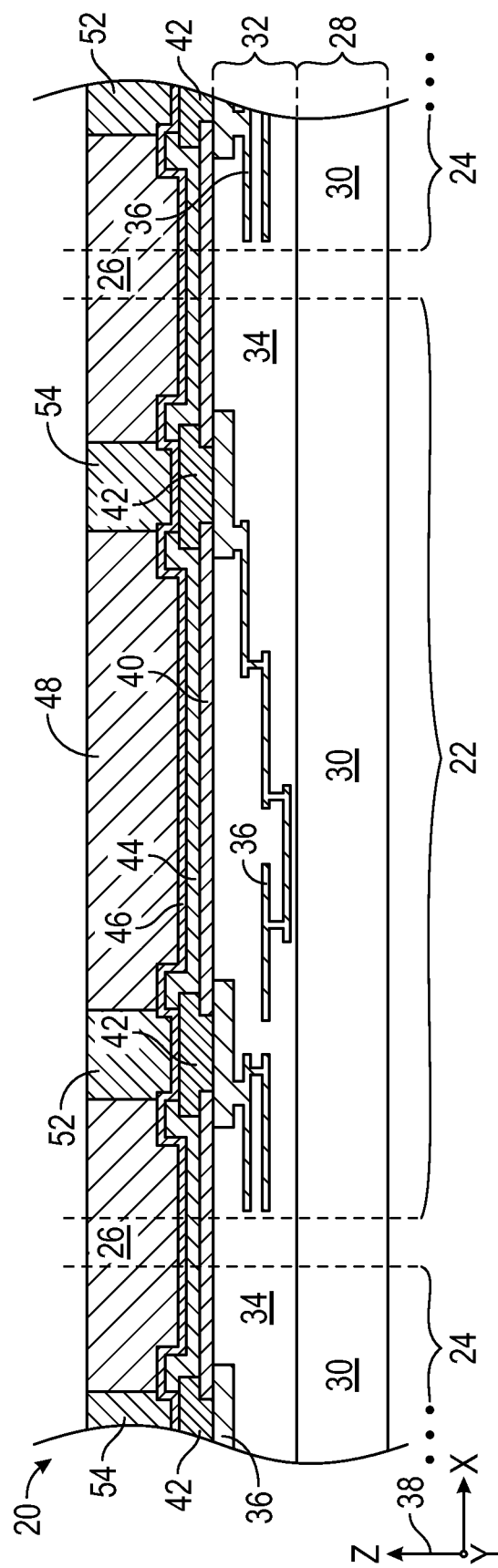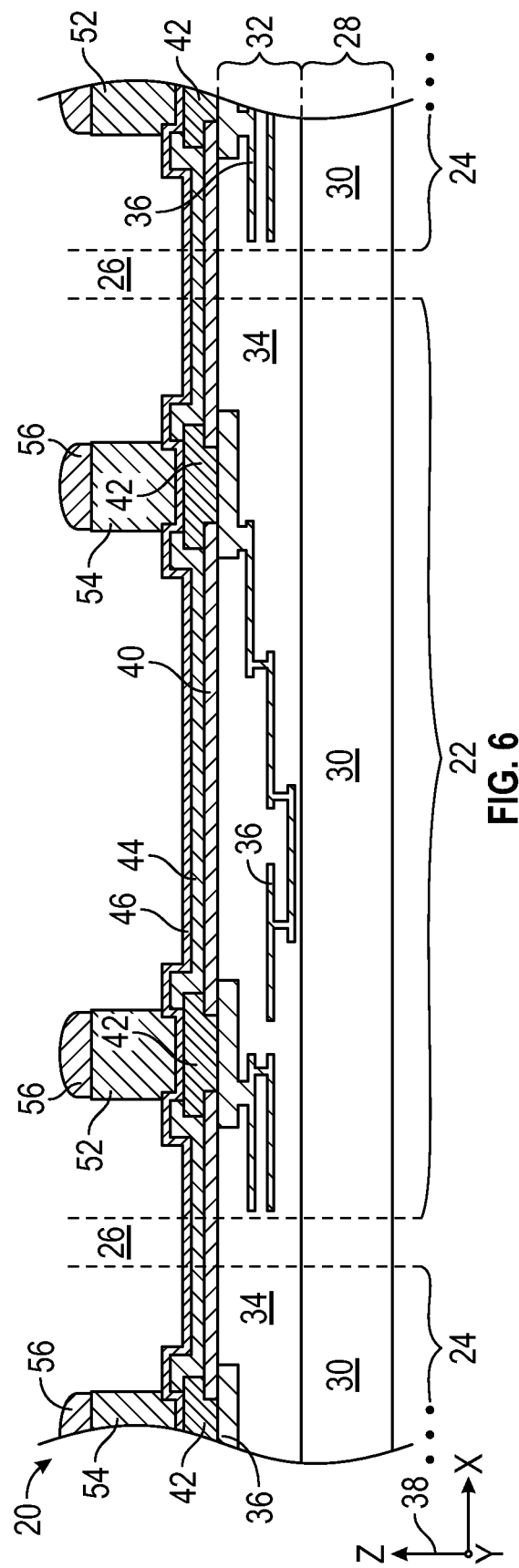

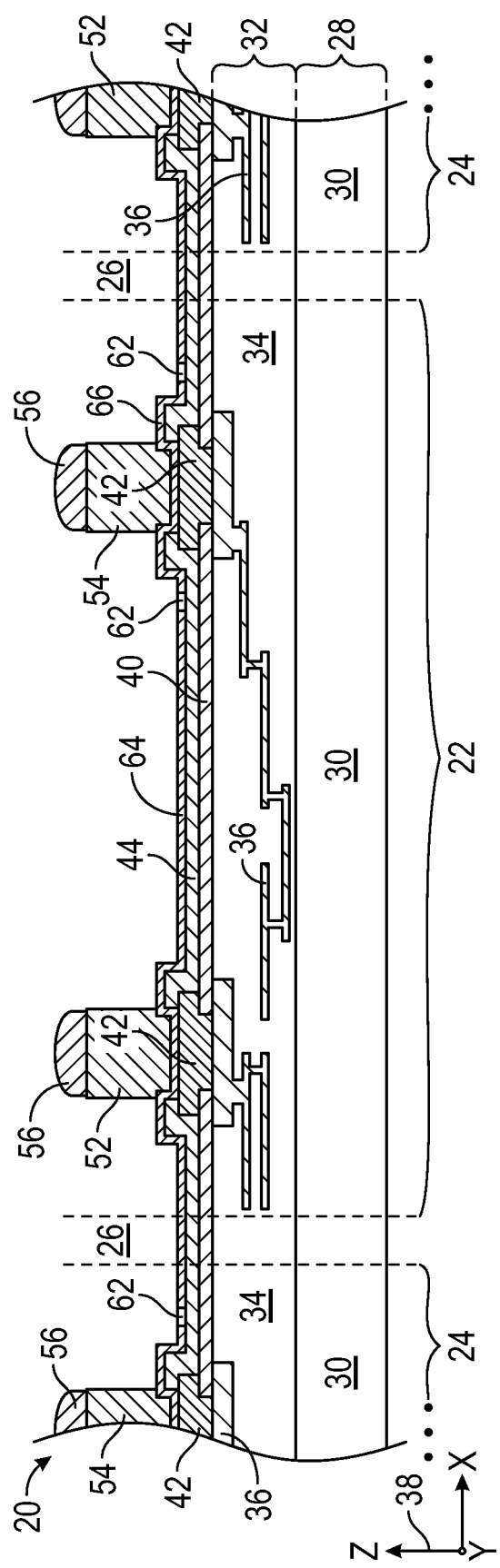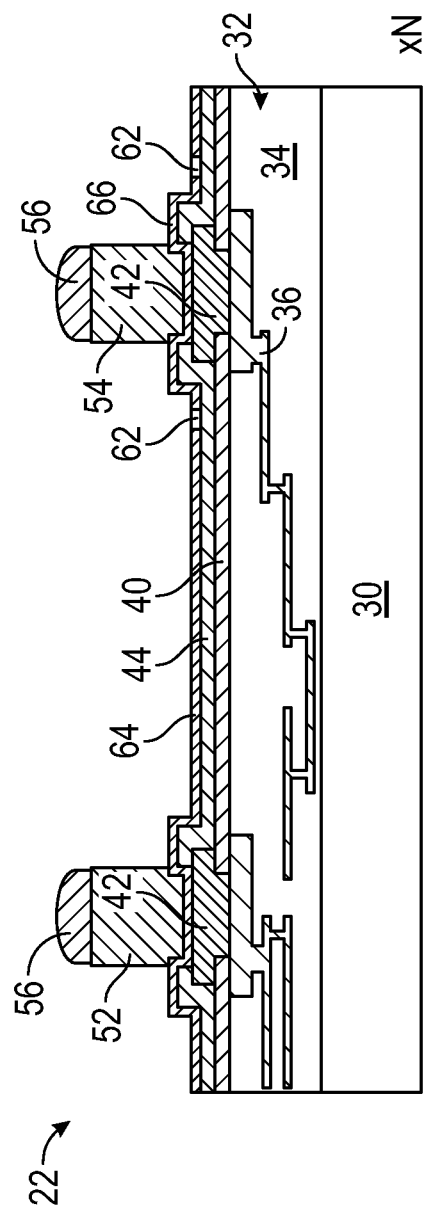
FIG. 9
FIG. 10

PLATED PILLAR DIES HAVING INTEGRATED ELECTROMAGNETIC SHIELD LAYERS

TECHNICAL FIELD

Embodiments of the present disclosure relate generally to semiconductor die and, more particularly, to plated pillar dies having die-level electromagnetic shield layers.

BACKGROUND

A plated pillar die includes an array of electrically-conductive pillars, which assume the form of metallic columns or rod-like projections extending from the frontside of the die. As indicated by the term "plated pillar," the electrically-conductive pillars are conventionally fabricated utilizing an electroplating process. During electroplating, an electrical potential is applied to a masked seed layer deposited on a die-containing wafer, with the pillars gradually compiled in tunnel-like openings defined in the seed layer as the process progresses. Following electroplating and mask layer stripping, those portions of the seed layer extending laterally beyond the plated pillars are removed by etching to prevent electrical bridging between the pillars. Solder caps may then be applied to the outer terminal ends of the plated pillars to facilitate subsequent interconnection of the plated pillar die by solder reflow to a second die, to a leadframe, to a printed circuit board, or to another routed substrate following wafer singulation. Relative to other interconnection approaches, such as wirebonding, the incorporation of plated pillars into integrated circuit dies can improve thermal and electrical performance characteristics by, for example, decreasing electrical resistance across the die input/output interface. Such attributes may be particularly beneficial in the context of semiconductor die bearing certain types of analog circuitry, such as radiofrequency circuitry operable at higher frequency ranges.

BRIEF DESCRIPTION OF THE DRAWINGS

At least one example of the present invention will hereinafter be described in conjunction with the following figures, wherein like numerals denote like elements, and:

FIGS. 1-9 are simplified cross-sectional views of a semiconductor wafer (a limited portion of which is shown) processed to fabricate plated pillar dies having die-level electromagnetic interface (EMI) shield layers, as illustrated in a step-by-step sequence in accordance with a first example manufacturing process flow of the present disclosure;

FIG. 10 is a simplified cross-sectional view of a singulated plated pillar die having an integrated die-level EMI shield layer and produced pursuant to singulation of the semiconductor wafer shown in FIGS. 1-9, as illustrated in accordance with an example embodiment;

Figure 7:
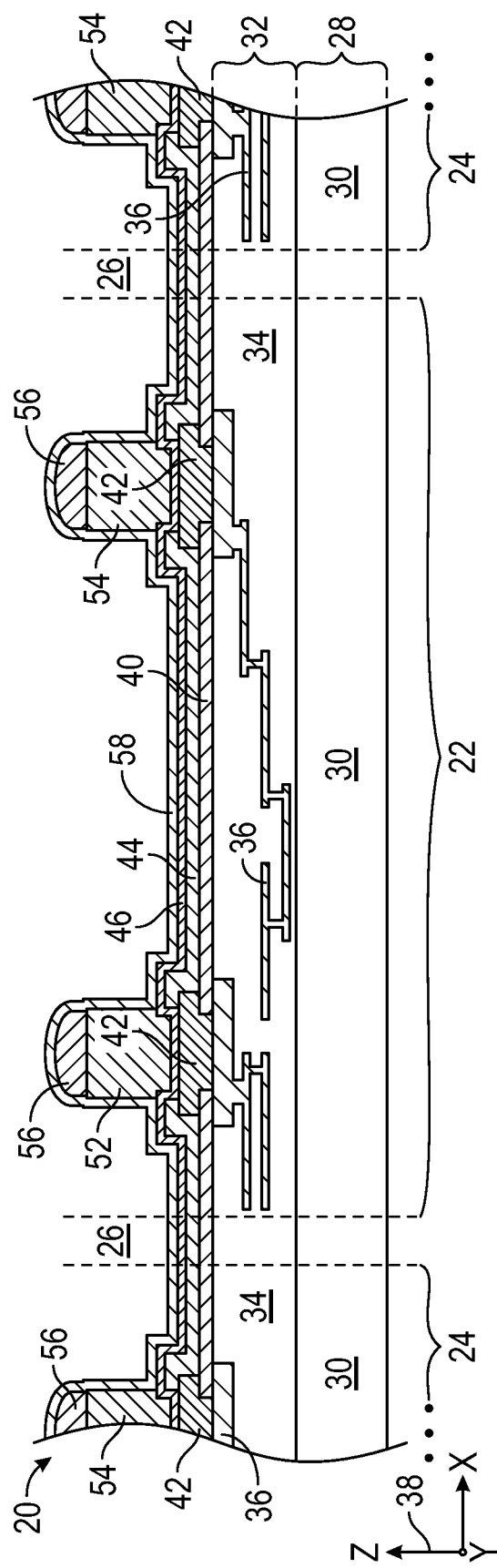
Figure 8:
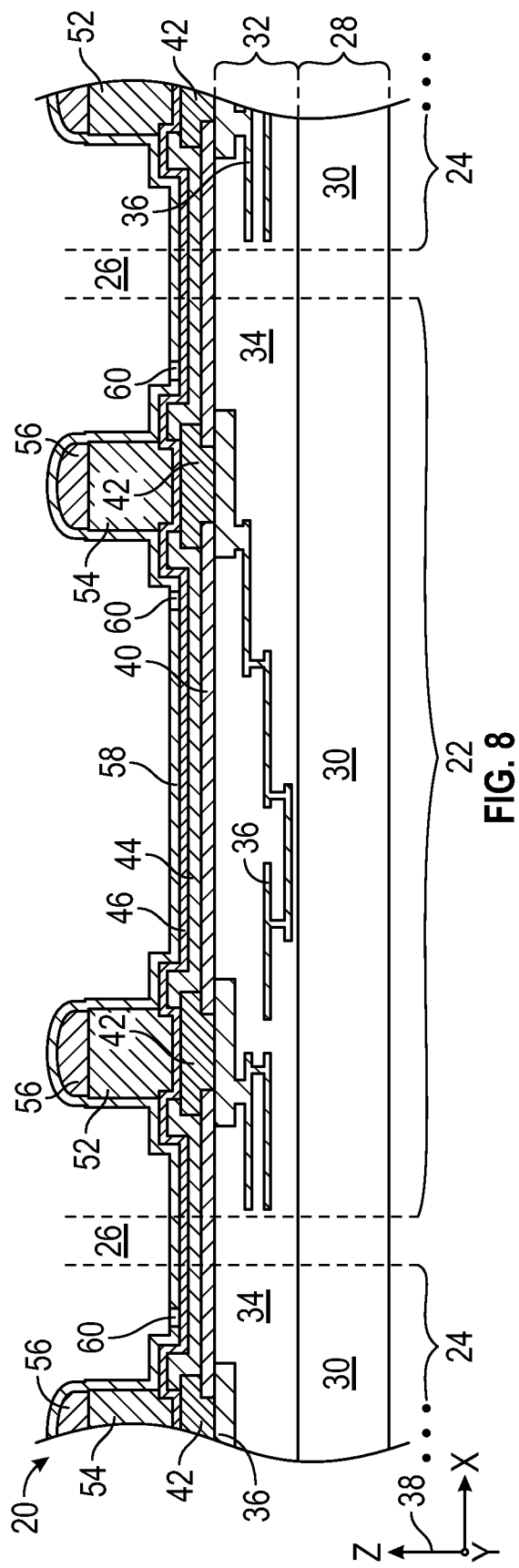

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as setforth the appended claims.

Overview

As indicated above, the incorporation of a plated pillar arrays into certain integrated circuit (IC) semiconductor dies can provide both thermal and electrical performance benefits, particularly in the case of IC dies bearing certain analog circuitry or radiofrequency circuit elements. However, as is the case with wirebonding and other die interconnection approaches, the incorporation of a plated pillar array into a given semiconductor die, considered in isolation, provides minimal benefit in shielding integrated circuitry from exposure to electromagnetic energy originating internally or externally to the die. In instances in which a given plated pillar die carries one or more circuit regions susceptible to electromagnetic interference (EMI), the occurrence of EMI can drastically alter or degrade semiconductor die performance depending upon, for example, EMI severity and the general sensitivity of the circuit regions to such interference. As a specific example, integrated circuitry containing integrated capacitors and inductors, such as analog-to-digital converter (ADC) clock trees, may be relatively sensitive to EMI; and, when exposed to sufficient levels of EMI, may be prone to mistiming or other performance detriments at certain harmonic orders. In the case of plated pillars dies installed within microelectronic packages, susceptibility to EMI-induced performance determents can be mitigated, to some extent, through the integration of electromagnetic shield features at the package level, with such package-level electromagnetic shield features dissipating, if not wholly blocking externally-generated electromagnetic energy from penetrating into the package and reaching the EMI-sensitive circuit regions of the die. Reliance on such a package-level EMI shielding, however, typically introduces additional constraints on package design, increases package fabrication costs, and is otherwise associated with various drawbacks. Further, the effectiveness of package-level EMI shielding may be limited due, in part, to a physical offset between the shield structure of the microelectronic package and the EMI-sensitive circuit regions of the plated pillar die.

An ongoing industry demand thus exists for EMI shielding solutions deployable at a die level and readily adaptable into existing process flows utilized in the fabrication of plated pillar dies. Embodiments of such EMI shielding solutions are provided herein in the form of plated pillar dies having die-level EMI shield layers and other associated structure features, as well as semiconductor wafer processing methods for concurrently fabricating multiple plated pillar semiconductors having integrated, die-level EMI shield layers. With respect to the presently-disclosed wafer processing methods, in particular, embodiments of the wafer processing method (or semiconductor die-forming method) leverage portions of the wafer-spanning metallic seed layer, as utilized for electroplating purposes in plated pillar process flows, to form die-level EMI shield layers. Following electroplating and build-up of the plated pillars across the frontside of a processed wafer, selected portions of the metallic seed layer are left intact through targeted etching to yield a wafer-level EMI shield layer, which is separated into die-level EMI shield layers upon wafer singulation. Such an approach stands in contrast to conventional process flows in which those portions of the metallic seed layer extending beyond the newly-formed plated pillars are removed in their entirety to provide electrical isolation between the plated pillars. Comparatively, in the context of the present disclosure, relatively limited, locally-targeted regions of the metallic seed layer are etched away or otherwise removed to produce electrical isolation gaps around selected plated pillars and, specifically, around a first type of pillar included in the plated pillars. Concurrently, selected portions of the metallic seed layer (e.g., a volumetric majority of the seed layer) is left intact and remains in electrical contact with second pillar type or grouping included in the plated pillars. Subsequently, the semiconductor wafer is diced or otherwise separated into a plurality of singulated plated pillar dies. The resulting plated pillar dies each include a die-level EMI shield layer formed from a singulated piece of the wafer-level EMI shield layer, plated pillars of the first pillar type electrically isolated from the die-level EMI shield layer, and plated pillars of the second pillar type electrically coupled to the die-level EMI shield layer.

Continuing description above, the first pillar type may assume the form of non-ground contact pillars, while the second pillar type assumes the form of ground contact pillars in embodiments. As appearing herein, the term "ground contact pillar" refers to a plated pillar configured to be coupled to electrical ground or an analogous low voltage and forming a portion of a current return path during operation of the plated pillar die. Comparatively, the term "non-ground contact pillar" refers to a plated pillar other than a ground contact pillar. When the circuitry integrated into a given plated pillar die contains one or more field effect transistors (FETs), the ground contact pillars may be electrically coupled to the FET source contacts through a number of electrically-conductive features (e.g., die bond pads interconnect lines) formed in frontside layers compiled over a plurality of semiconductor dies when in wafer form during back-end-of-line (BEOL) processing. A subset of the non-ground contact pillars may be electrically coupled to the FET drain contacts, while the remaining non-ground contact pillars are electrically coupled to the FET gate contacts or other semiconductor devices. In other instances, a different electrical interconnection scheme may be employed when, for example, the plated pillar dies carry bipolar transistors having collector, base, and emitter contacts. Regardless of the particular type of transistors or other circuit elements integrated into a given plated pillar die, the plated pillars (potentially along with associated solder caps or other conductive terminal features) generally form the input/output (I/O) interface of the plated pillar, with the second pillar type electrically coupled to ground (the current return path) when the plated pillar die is installed in a larger system, module, or device. Accordingly, in at least some embodiments, the die-level EMI shield layer may be electrically grounded during operation of the plated pillar die to maximize the effectiveness of the EMI shield layer in reducing, if not wholly blocking electromagnetic energy from penetrating to EMI-susceptible regions of the circuitry integrated into the plated pillar die.

A relatively large fraction of the metallic seed layer initially utilized to support electroplating deposition of the plated pillars may be left intact and ultimately utilized to form relatively expansive die-level EMI shield layers providing broad physical coverage of the plated pillar die frontside. For example, in embodiments, the die-level EMI shield layers may be formed to cover at least 90% of the frontside surface area of each singulated plated pillar die, with limited regions of the metallic seed layer removed as needed to produce the electrical isolation gaps around plated pillars of the first type. Additionally, in at least some implementations, the die-level EMI shield layer may overlie or canopy the substantial entirety of one or more EMI-susceptible circuit regions contained the plated pillar die, as taken by surface area and viewed along an axis orthogonal to the metallic seed layer. Examples of such EMI-susceptible circuit regions include analog circuitry containing integrated capacitors and inductors, such circuitry forming an analog-to-digital converter (ADC) clock tree in the case of a plated pillar die bearing radiofrequency circuitry. As previously indicated, such ADC clock trees may be vulnerable to performance detriments (e.g., decreased timing accuracy) when unshielded and exposed to electromagnetic energy over certain frequency ranges (e.g., frequencies equal to or greater than 1.28 gigahertz (GHz)) and associated harmonic orders. Through the integration of comprehensive, grounded EMI-shield layers into plated pillar dies bearing such circuitry, such EMI-related performance detriments can be mitigated, if not wholly avoided. Further, as once-sacrificial layer regions are now leveraged or repurposed to now form the die-level EMI shield layers, additional material costs are negligible and relatively few additional process steps need be performed to integrate the present teachings into existing wafer process flows. Consequently, embodiments of wafer processing methods described herein can be readily adopted to provide die-level EMI solutions, while maintaining cost effective, streamlined manufacture of plated pillar dies.

Embodiments of the present disclosure provide other benefits in addition to the streamlined, cost effective incorporation of die-level EMI shield layers into plated pillar dies. For example, in at least some implementations, the below-described wafer processing methods enable the provision of robust and relatively direct or "hard" electrical connection between the grounded conductors of a plated pillar die (here, through the die-level EMI shield layer) and a seal ring structure extending around an outer peripheral region of the die frontside to reduce ionic contamination entering the die cavity and/or serving as a "crack stop" feature, which decreases the likelihood of crack formation and propagation during wafer singulation. In such implementations, the die-level EMI shield layer may be formed in contact with such a seal ring structure, with the seal ring structure electrically coupled to the plated pillars of the second pillar type through the EMI shield layer. By virtue of such a structural arrangement, an optimized, direct ground connection is provided to the seal ring structure, while the overall electrical routing layout of the plated pillar die is simplified. Further description of an example seal ring structure, as grounded through a die-level EMI shield layer, is provided below in connection with FIGS. 12-13. More generally, a first example process flow for processing an IC die-containing semiconductor wafer to concurrently fabricate a plurality of plated pillar dies having integrated, die-level EMI shield layers is discussed below in conjunction with FIGS. 1-13. Additionally, second example process flow for processing a semiconductor wafer to fabricate a plurality of plated pillar dies having die-level EMI shield layers is further discussed below in conjunction with FIGS. 14 and 15. The following example processing flows are presented by way of non-limiting illustration only and should not be interpreted to unduly restrict the scope of the present invention.

Example Wafer Processing Method for Producing Plated Pillar Dies with Integrated EMI Shield Layers FIG. 1 is a simplified cross-sectional view of a processed semiconductor wafer 20 containing a number of pre-singulated plated pillar dies 22, 24, as shown in partially-fabricated state and illustrated in accordance with an example embodiment Only a limited portion of semiconductor wafer 20 is shown in FIG. 1, with the illustrated wafer portion encompassing a first plated pillar die 22 and neighboring portions of two laterally-adjacent plated pillar dies 24. Singulation regions 26, further shown in FIG. 1 and demarcated by dashed lines for illustrative clarity, extend between the illustrated plated pillar dies 22, 24 and the other non-illustrated plated pillar dies distributed across semiconductor wafer 20. Singulation regions 26 represent the regions of semiconductor wafer 20 removed when semiconductor wafer 20 is singulated into a plurality of discrete plated pillar dies, as discussed below in connection with FIGS. 9 and 10. Singulation regions 26 may thus represent saw streets or scribe lanes in embodiments in which semiconductor wafer 20 is singulated utilizing a dicing sawing, noting that the particular manner in which wafer 20 is singulated is generally inconsequential to embodiments of the present disclosure.

Semiconductor wafer 20 has previously underwent front-end-of-line (FEOL) processing at the stage of manufacture shown in FIG. 1. Accordingly, integrated circuitry has been formed in and on the semiconductor-containing body or substrate of wafer 20, referred to herein as "wafer body 28." When singulated, semiconductor wafer body 28 is separated into multiple pieces or die bodies 30 bearing integrated circuitry supporting operation of plated pillar dies 22, 24, when completed. An example of plated pillar die 24 in a completed form is shown in FIG. 10 and discussed below. Semiconductor wafer body 28, and therefore die bodies 30 yielded by singulation of wafer body 28 into discrete pieces, may be imparted with any semiconductor material-containing structure or composition suitable for supporting the fabrication of integrated circuitry through FEOL wafer processing. In certain embodiments, wafer body 28 (and, by extension, the die bodies 30 produced pursuant to wafer singulation) may consistent entirely of a single semiconductor material, such as bulk silicon (Si). In other embodiments, wafer body 28 may have a more complex, layered structure or composition, such a layered Gallium Nitride (GaN) structure, a layered Gallium Arsenide (GaAs) structure, or a silicon-on-insulator (SOI) structure. Diamond- and glass-based substrates may also be utilized, again noting that embodiments of presently-disclosed wafer processing methods are compatible with essentially all semiconductor-material containing structures suitable for usage in wafer processing and IC die fabrication.

Semiconductor wafer 20 has further been subject a number of back-end-of-line (BEOL) processing steps at the stage of manufacture shown in FIG. 1. Accordingly, a number of BEOL layers 32 (hereafter, "frontside layers 32") have been formed across the frontside of wafer body 28 and, therefore, the respective frontsides of the presingulated die bodies 30. Frontside layers 32 may contain any number of dielectric layers, which are successively deposited during BEOL processing to form a dielectric body 34 in which a number of electrically-conductive features 36 are located. Electrically-conductive features 36 include metallic interconnect lines, as well as metallic plugs or vias providing vertical interconnections appropriate to produce the desired wiring structure across the respective frontsides of the plated pillar dies 22, 24; the term "vertical," as appearing herein, defined as a direction extending parallel to an axis normal or orthogonal to the frontside of wafer body 28, which corresponds to the Z-axis of a coordinate legend 38 appearing in the lower left of FIG. 1. A die pad dielectric layer 40 is produced over dielectric body 34 and patterned to include openings in and above which a number of electrically-conductive die pads 42 are formed. Lastly, a solder mask layer 44 is deposited over die pad dielectric layer 40 and partially overlays or encroaches onto the upper surfaces of die pads 42; the term "upper," and similar terms of orientation appearing herein, defined in relation to proximity to the frontside of wafer body 28 and the respective frontsides of die bodies 30. Openings are formed in solder mask layer 44 to expose surface portions of die pads 42 for physical joinder to additional electrically-conductive features and, particularly, for contact with a metallic seed layer utilized for electroplating purposes, as described below in connection with FIG. 2.

Advancing to FIG. 2, a metallic seed layer 46 is deposited across the frontside of semiconductor wafer 20 and, specifically, over solder mask layer 44 and die pads 42. Metallic seed layer 46 extends into the openings formed in solder mask layer 44 to contact die pads 42, with seed layer 46 spanning the entirety or substantial entirety of the wafer frontside to allow electrical contact to a suitable voltage or current source along the outer edges of the wafer during the subsequently-performed electroplating process. As appearing herein, the term "metallic," whether utilized in reference to metallic seed layer 46, the below-described plated pillars, or another structural feature, refers to a material composition predominately composed of one or more metals, by weight. Similarly, reference to a particular structural element or feature as composed of a named metal, such as aluminum (Al), copper (Cu), gold (Au), or nickel (Ni), indicates that the structural or feature is predominately composed of the named metal, by weight, but may also contain lesser amounts of any number and type of additional metallic or non-metallic constituents. Finally, reference to an alloy or other material as containing two (or more) named metals, such as titanium tungsten (TiW), indicate that the alloy or material is predominately composed of the named metal, by weight In embodiments, metallic seed layer 46 may be composed of a single metallic (e.g., Cu) layer deposited by physical vapor deposition (PVD), by chemical vapor deposition, or by electroless plating, to list but a few examples.

In other instances, metallic seed layer 46 may itself be composed of multiple layers of varying compositions. As an example in this latter regard, metallic seed layer 46 may have a bi-layer structure in embodiments composed of a first metallic (e.g., TiW) sub-layer over which a relatively thin Cu film is formed; e.g., by sputter deposition or utilizing another vapor deposition technique. In still other cases, metallic seed layer 46 may be imparted with a different multi-layer or single layer structure and may be formed utilizing other deposition techniques; providing that the resulting metallic seed layer is amenable to electroplating and can be effectively transformed into a number of die-level EMI shield layers when subject to further processing, as described more fully below.

As indicated in the simplified cross-section of FIG. 2, metallic seed layer 46 may be deposited as a conformal layer have a substantially uniform thickness and generally following the frontside topology of semiconductor wafer 20. The global average thickness of metallic seed layer 46 will vary between embodiments, but may range from about 100 to about 1000 Angstroms (Å) in at least some implementations. The lower end of this example range may be selected to ensure that adequate thickness is provided not only to support the electroplating process, but to further optimize usage of non-sacrificial regions of metallic seed layer 46 for EMI shielding purposes. In the latter regard, the minimum thickness of metallic seed layer 46 for usage in EMI shielding will vary depending upon, for example, the skin depth corresponding to the intended operational frequency or frequency range of the plated pillar dies 22, 24 when bearing radiofrequency circuitry. It has been determined that in some embodiments at higher frequencies (e.g., frequencies ranging from about 1 to about 3 GHz), that EMI shielding layers having at least 100 Å thickness are generally sufficient to provide the desired EMI blocking function, given the skin depth (the degree of radiofrequency energy penetration in a thickness direction) at such frequencies is typically less than this minimum thickness for the materials from which metallic seed layer 46 is commonly composed. Depending upon implementation specifics, the upper end of the above-mentioned example range may be selected to minimize unnecessary material costs and reduce the duration of the electroplating process as additional thickness of metallic seed layer 46 beyond this upper limit (in this example, about 1000 Å). This stated, in other embodiments, metallic seed layer 46 may be deposited to have a global average thickness thicker or thinner than the aforementioned range.

An electroplating mask layer 48 is next deposited over metallic seed layer 46, with the resultant structure shown in FIG. 3. Electroplating mask layer 48 is conveniently composed of photo-sensitive polymer or another photoresist material amenable to patterning by photolithography; however, any material can be utilized amenable to patterning at an adequate resolution to define openings through which selected regions of metallic seed layer 46 are exposed for subseuqent etching. Electroplating mask layer 48 is deposited to a sufficient thickness to accommodate the desired height of the subsequently-formed plated pillars; e.g., the electroplating mask layer 48 may be deposited to thickness between about 10 and about 1000 microns (µm) in certain embodiments. Photolithography is then carried-out to pattern electroplating mask layer 48 and produce a number of plating channels or openings 50 therein. Referring to FIG. 4, plating openings 50 penetrate fully through electroplating mask 48 to reveal or expose regions of metallic seed layer 46 from the exterior of masked wafer, thereby allowing ingress of the plating bath solution into openings 50 when the masked wafer is at least partially submerged in the bath during the electroplating process. Plating openings 50 are generally formed at those locations at which it is desired to compile or build-up plated pillars during the ensuing electroplating process. As shown in FIG. 4, such locations typically overlie or vertically align with die pads 42, as taken along axes orthogonal or normal to metallic seed layer 46 (parallel to the Z-axis of coordinate legend 38). It is possible, however, for one or more plating openings 50 to be formed in electroplating mask layer 48, and therefore for one or more plated pillars to be produced, at locations on metallic seed layer 46 that do not precisely overlie die pads 42 if, for example, such location corresponding with the below-described EMI shield layers.

Progressing to FIG. 5, electroplating is carried-out to compile or build-up plated pillars 52, 54 within the plating openings of electroplating mask layer 48. A suitable electric potential is applied to metallic seed layer 46 during the electroplating process to attract the appropriate constituents from the plating bath for deposition as plated pillars 52, 54. The plating bath formulation and process parameters (e.g., voltages, agitation levels, and duration) will vary depending upon implementation.

Figure 12:
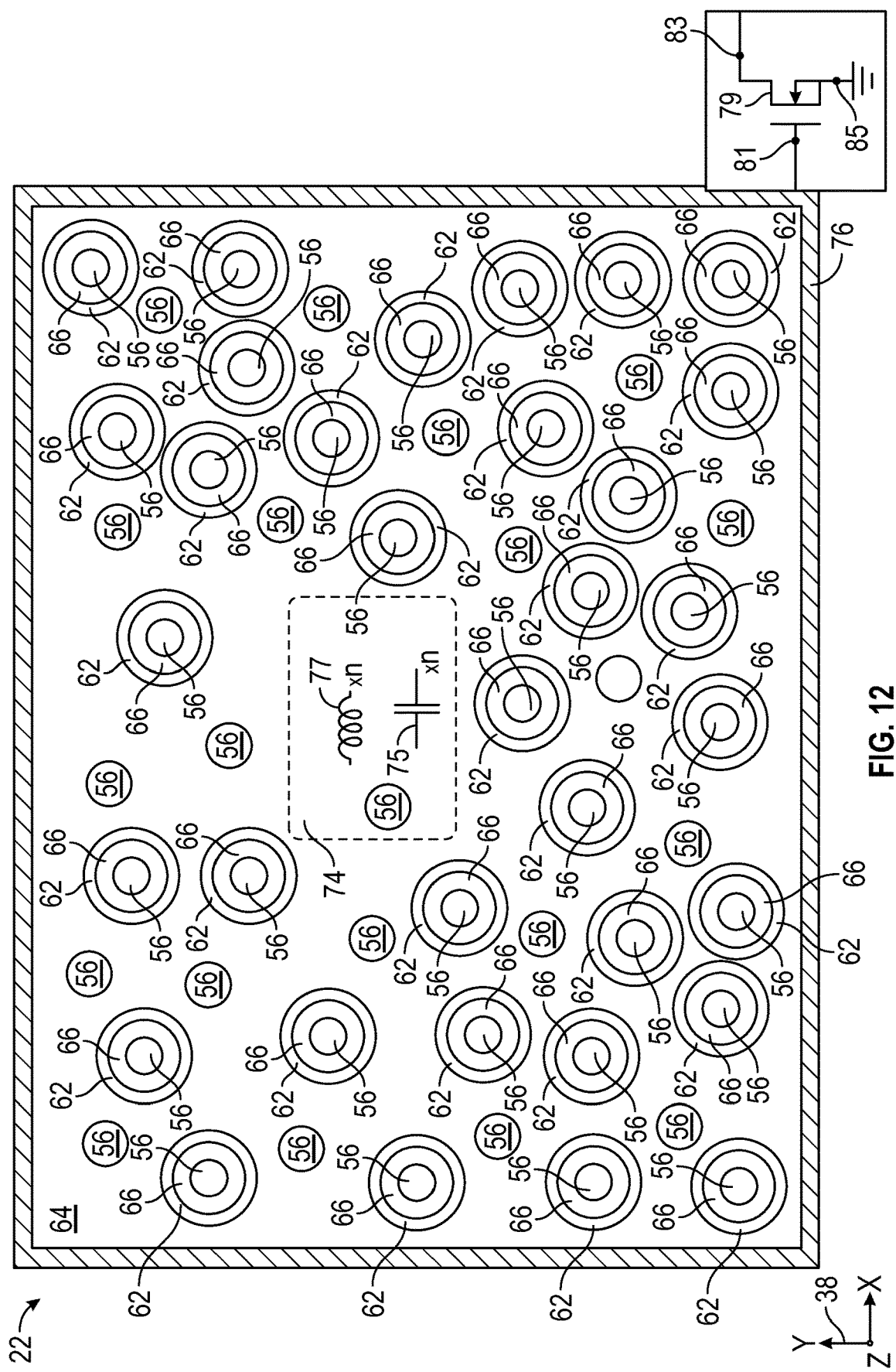
FIG. 12 is a top-down or planform view of the example singulated plated pillar die shown in FIG. 10, which more clearly illustrates the EMI shield layer, a distribution of a first plated pillar type electrically coupled to the EMI shield layer, and a distribution of a second plated pillar type electrically isolated from the EMI shield layer by isolation gaps defined by metallic seed layer patterning.
Figure 13:
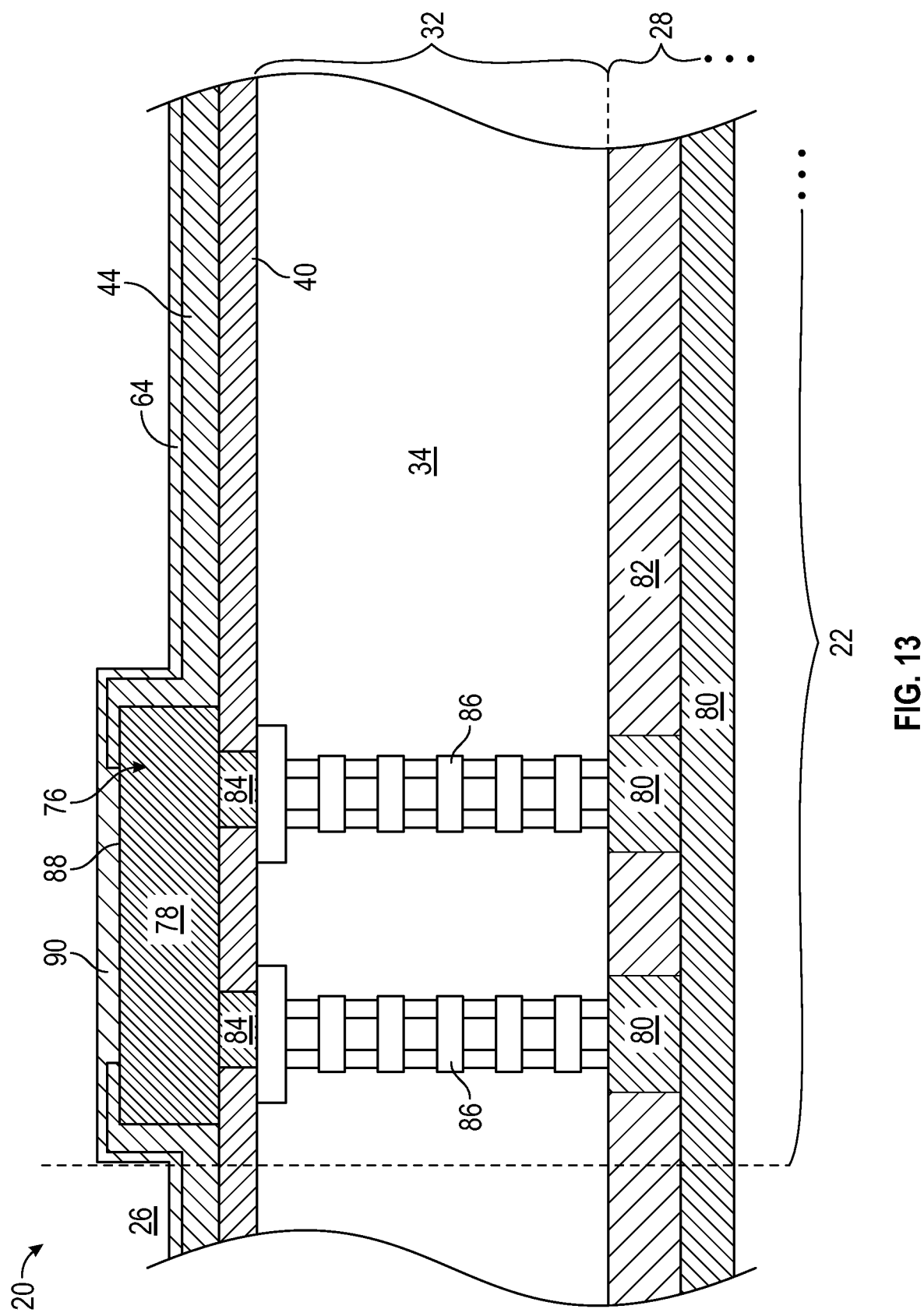
FIG. 13 is a detailed cross-sectional view of an upper corner or edge region of the example plated pillar die shown in FIGS. 10 and 12, which more clearly depicts one manner in which the die-level EMI shield layer may electrically contact a peripheral seal ring structure further included in embodiments of the plated pillar die.

Generally, the plating bath is formulated to impart plated pillars 52, 54 with a metallic composition capable of forming an adequate bond with metallic seed layer 46, while having a relatively low electrical resistivity. Plated pillars 52, 54 will often be composed of plated Cu (that is, contain Cu as the predominate pillar constituent, by weight), but other materials (e.g., Au or Ni) can be utilized, as well. Plated pillars 52, 54 may or may not fully occupy the plating openings formed in electroplating mask layer 48, providing that plated pillars 52, 54 are deposited to or somewhat beyond their desired final height In embodiments, in which plated pillars 52, 54 are deposited to an excessive height, additional bulk may be removed from plated pillars 52, 54 through subsequent etching or polishing steps to impart plated pillars 52, 54 with a substantially uniform height within desired tolerances. As indicated above, the final average height of plated pillars 52, 54 will vary between embodiments, but may be at least 100 times greater than the average global thickness of metallic seed layer 46 in embodiments; or, stated conversely, the average global thickness of metallic seed layer 46 may be at least 100 times less than the average pillar height of plated pillars 52, 54 in at least some implementations. Generally, plated pillars 52, 54 may be distributed across the frontsides of processed semiconductor wafer 20 in any suitable arrangement, as determined by the wiring or electrical routing design of plated pillar dies 22, 24. An example of one manner in which plated pillars 52, 54 may be distributed across the frontside of plated pillar die 22, when completed, is shown in FIG. 12.

As produced to the above-described electroplating process, plated pillars 52, 54 may be divided into two general categories or "plated pillar types." Plated pillars 52, 54 of the first pillar type are identified by reference numeral "54" in the illustrated example and may assume the form of non-ground contact pillars. For this reason, plated pillars of the first pillar type are specifically referred to below as "non-ground contact pillars 54." Comparatively, plated pillars 52, 54 of the second pillar type are identified by reference numeral "52" and may assume the form of ground contact pillars. For this reason, plated pillars of the second pillar type are referred to hereafter as "ground contact pillars 52." As previously noted, the term "ground contact pillar" refers to a plated pillar forming a portion of an established electrical path, which is coupled to electrical ground or an analogous low voltage when plated pillar dies 22, 24 are completed and ultimately utilized with a particular device or system. Comparatively, the term "non-ground contact pillars" refers to any plated pillar type that is not a ground contact pillar. Generally, plated pillars 52, 54, and the associated solder caps 56, may form the respective I/O terminals of the plated pillars dies 22, 24 allowing for the application of input signals, output signals, and control signals, as appropriate. The specific terminology utilized to identify the I/O terminals of the plated pillars dies 22, 24 will vary based upon, for example, the transistor type or other circuit elements integrated into plated pillar dies 22, 24 during FEOL processing.

For the purposes of the following description, plated pillar dies 22, 24 will be described as each bearing at least one FET utilized, for example, to produce a Doherty amplifier or other power amplifier circuit. In such embodiments, ground contact pillars 52 may be electrically coupled to the source contacts of the FETs integrated into plated pillar dies 22, 24; a first subset of non-ground contact pillars 54 may be electrically coupled to the gate contacts of the FETs integrated into plated pillar dies 22, 24; and a second subset of non-ground contact pillars 54 may be electrically coupled to the drain contacts of the FETs integrated into plated pillar dies 22, 24. When incorporated into the circuitry integrated into plated pillar dies 22, 24, the FETs may be implemented utilizing any of the following transistor technologies: a silicon-based field effect transistor (e.g., a laterally-diffused metal oxide semiconductor FET or LDMOS FET) or a III-V FET (e.g., a GaN FET, a GaAs FET, a gallium phosphide (GaP) FET, an indium phosphide (InP) FET, or an indium antimonide (InSb) FET, or another type of III-V transistor). In alternative embodiments of the present disclosure can be implemented utilizing other transistor types formed in plated pillar dies 22, 24, however, including bipolar transistors. Generally, then, embodiments of the present disclosure are not restricted to usage in conjunction with any particular transistor type, die technology, or signal/power routing scheme. Further, embodiments of the present disclosure are compatible with a wide range of complementary metal-oxide-semiconductor (CMOS) processing nodes and can be utilized to produce plated pillar dies bearing other types of integrated circuitry, as well as microelectromechanical systems (MEMS) devices.

In the example process flow shown in FIGS. 1-11, electroplating mask layer 48 is stripped or otherwise removed following the above-described electroplating process. Prior to or following mask layer stripping, solder caps 56 may be formed in physical and electrical with the upper terminal ends of plated pillars 52, 54; that is, the plated pillar ends located furthest from semiconductor wafer body 30. When provided, solder caps 56 facilitate subsequent mechanical mounting and electrical interconnection of plated pillar dies 22, 24 (when separated into discrete units following wafer singulation) to a second die, to a leadframe, to a printed circuit board (PCB), or to another routed substrate by solder reflow, while the singulated plated pillar die is placed in an inverted orientation, as discussed more fully below in connection with FIG. 11. In further embodiments, solder caps 56 may not be provided and another electrically-conductive material, such as discrete globs of an electrically-conductive paste (e.g., a solder paste) or an electrically-conductive epoxy, may be utilized to provide the desired mechanical mounting and electrical interconnection of plated pillar dies 22, 24, when singulated. Still other interconnection techniques can also be utilized to provide the desired electrical connections when, following wafer singulation, plated pillar dies 22, 24 are installed in a larger system, module, or package; e.g., in certain cases, such as when a given plated pillar die is encapsulated in a flat no-lead package in which the outer terminal surfaces of plated pillars 52, 54 are exposed along (coplanar with) an outer surface of the package body, wirebonding or another interconnection technique can be utilized to form the desired electrical interconnections with the exposed pillar surfaces.

Following formation of plated pillars 52, 54 and application of solder caps 56 (if present), a post-plating mask layer 58 (e.g., a polymeric etch resist) is deposited onto the frontside of semiconductor wafer 20. As shown in FIG. 7, post-plating mask layer 58 may be deposited as a conformal layer contacting and extending over metallic seed layer 46, plated pillars 52, 54 (specifically contacting the pillar sidewalls), and solder caps 56 (if present). The post-plating mask layer 58 may be composed of a photo imageable polymer amenable to photolithography or instead composed of any other material suitable for usage in forming a patterned etch mask. Considering the relatively pronounced topology or undulating geometry of the frontside of semiconductor wafer 20 due to the presence of freestanding plated pillars 52, 54, certain common deposition techniques, such as spin-on application techniques, may be poorly suited for the deposition of post-plating mask layer 58. For at least this reason, post-plating mask layer 58 is conveniently applied utilizing a spray-on coating technique in embodiments of the present disclosure. In other instances, a different deposition technique may be employed to deposit post-plating mask layer 58; e.g., a dip process may be utilized in which wafer 20 is lowered into a liquid photoresist bath in an inverted (pillar first) orientation and partially submerged to the extent required to apply a substantially uniform coating to metallic seed layer 46. After mask layer deposition, post-plating mask layer 58 is patterned to define a number of mask layer openings 60 through which selected regions of metallic seed layer 46 are exposed, with an example of the resultant structure shown in FIG. 8. Post-plating mask layer 58 may be patterned through laser exposure for photosensitive materials or laser ablations (avoiding the need to utilize photosensitive materials) in embodiments, with still other patterning techniques potentially utilized in alternative implementations of the present disclosure depending upon the composition of post-plating mask layer 58.

The regions of metallic seed layer 46 exposed through mask layer openings 60 formed in post-plating mask layer 58 are next removed utilizing, for example, a localized dry or wet etch process selective to the material (e.g., Cu) from which metallic seed layer 46 is formed. The resultant structure (depicted after stripping of post-plating mask layer 58) is shown in FIG. 9, with the newly-removed portions of metallic seed layer 46 forming a number of electrical isolation motes or gaps 62 within the remaining portions of seed layer 46. As labeled in this drawing figure, removal of targeted regions of metallic seed layer 46 (that is, post-plating patterning of seed layer 46) transforms the remaining portions of metallic seed layer 46 into at least two types of structural elements or features: (i) a number of EMI shield layers 64, and (ii) pillar skirt regions 66. Electrical isolation gaps 62 are each formed around non-ground contact pillars 54 (e.g., non-source contact or non-Vss pillars when FET-containing circuitry is integrated into plated pillar dies 22, 24) and, in embodiments, may be patterned to possess generally annular or ring-shaped planform geometries. Additionally, and as most clearly shown in FIG. 12 (described below), each electrical isolation gap 62 may be substantially concentric with the particular non-ground contact pillar 54 around which the electrical isolation gap 62 is formed, although this is non-essential. EMI shield layers 64 are jointly referred to herein as forming a "wafer-level" EMI shield layer when referring to those portions of the global metallic seed layer patterned to define the die-level EMI shield layers, which collectively span the frontside of wafer 20. Comparatively, the portions of the waver-level EMI shield layer contained within each plated pillar die 22, 24, and remaining at an integral feature of each plated pillar die following wafer singulation, are referred to herein as "die-level" EMI shield layers. Finally, in certain embodiments, certain non-source pillars may be electrically coupled to EMI shield layers 64 to, for example, provide diode connections, while this may not be the case in other embodiments.

In the above-described manner, electrical isolation gaps 62 formed by seed layer patterning provide the requisite electrical isolation between different pillar types of the plated pillars 52, 54 between which electrical bridging is prohibited. In the illustrated example, specifically, electrical isolation gaps 62 provide the electrical isolation between non-ground contact pillars 54 (e.g., coupled to non-Vss pillars when FET-containing circuitry is integrated into plated pillar dies 22, 24) and ground contact pillars 52 (e.g., coupled to Vss pillars, such as VDD pillars, gate input pillars, and possibly other pillar types, such as gate bias pillars) when FET-containing circuitry is integrated into plated pillar dies 22, 24). Concurrently, the newly-defined EMI shield layers 64 are formed in direct electrical contact with ground contact pillars 52. EMI shield layers 64 may thus be electrically grounded through ground contact pillars 52 when plated pillar dies 22, 24 are ultimately installed within a larger microelectronic assembly, module, or system. Additional description of structural features resulting from pattering of metallic seed layer 46 is provided below in connection with FIG. 12. First, however, additional description of the final stages of wafer processing and an example deployment case of plated pillar die 22 is provided below in connection with FIGS. 10 and 11 to further establish a non-limiting context in which embodiments of the present disclosure may be better understood.

Following transformation of metallic seed layer 46 into EMI shield layers 64 and pillar skirt regions 66 through patterning creating electrical isolation gaps 62, any number of additional wafer processing steps may be performed to complete wafer processing, as desired. For example, in certain cases, passivation or anti-tarnish layers may be further formed over the frontside of semiconductor wafer 20. Consequently, electrical isolation gaps 62 may be filled with a dielectric material deposited through additional processing stages in certain instances. More commonly, however, additional materials layers are not formed over the wafer frontside following patterning of metallic seed layer 46 such that electrical isolation gaps 62 remain as unfilled air voids at least through wafer singulation, noting that electrical isolation gaps 62 may be later filled with a dielectric material if incorporated into an encapsulated package or subject to back-fill post mounting. In either instance, wafer singulation is ultimately carried-out to separate wafer 20 into a number of discrete singulated die units, here a number of singulated plated pillar dies 22, 24. Plated pillar die 22 is shown in a singulated state in FIG. 10, with the appended "xn" symbol indicating that any practical number of similar or identical plated pillar dies may be produced pursuant to singulation of semiconductor wafer 20. As can be seen, the example singulated plated pillar die 22 includes a die-level EMI shield layer 64 formed from a singulated piece of the wafer-level EMI shield layer, plated pillars of a first pillar type (non-ground contact pillars 54) electrically isolated from die-level EMI shield layer 64, and plated pillars of a second pillar type (ground contact pillars 52) electrically coupled to the die-level EMI shield layer 64.

With continued reference to FIG. 10, singulated plated pillar die 22 may be described as containing a die body 30 in which integrated circuitry is at least partly formed (again noting that transistors or other circuit elements may be formed both in and above the active, semiconductor material-containing surface regions of die body 30). Frontside layers 32 are formed over die body 30 and include die pads, which are electrically coupled to the integrated circuitry formed in plated pillar die 22. Additionally, a metallic seed layer (a singulated piece of the wafer-spanning seed layer described above in connection with FIG. 2) is formed over the frontside layers 32. Further, the metallic seed layer contained within plated pillar die 22 is patterned to define: (i) pad overlay regions in contact with die pads 42 (namely, those regions of the metallic seed layer located vertically between plated pillars 52, 54 and die pads 42); (ii) a die-level EMI shield layer 64 extending to a first subset of the pad overlay regions (namely, the pad overlay regions located beneath and contacting ground contact pillars 52), and (iii) electrical isolation gaps 62 formed around a second subset of the pad overlay regions (namely, the pad overlay regions located beneath and contacting non-ground contact pillars 54). Finally, singulated plated pillar die 22 includes plated pillars of a first pillar type (here, non-ground contact pillars 54) electrically coupled to the integrated circuitry through the first subset of the pad overlay regions and electrically isolated from die-level EMI shield layer 64 by electrical isolation gaps 62, as well as plated pillars of a second pillar type (namely, ground contact pillars 52) electrically coupled to the integrated circuitry and to die-level EMI shield layer 64 through the second subset of the pad overlay regions.

Figure 11:
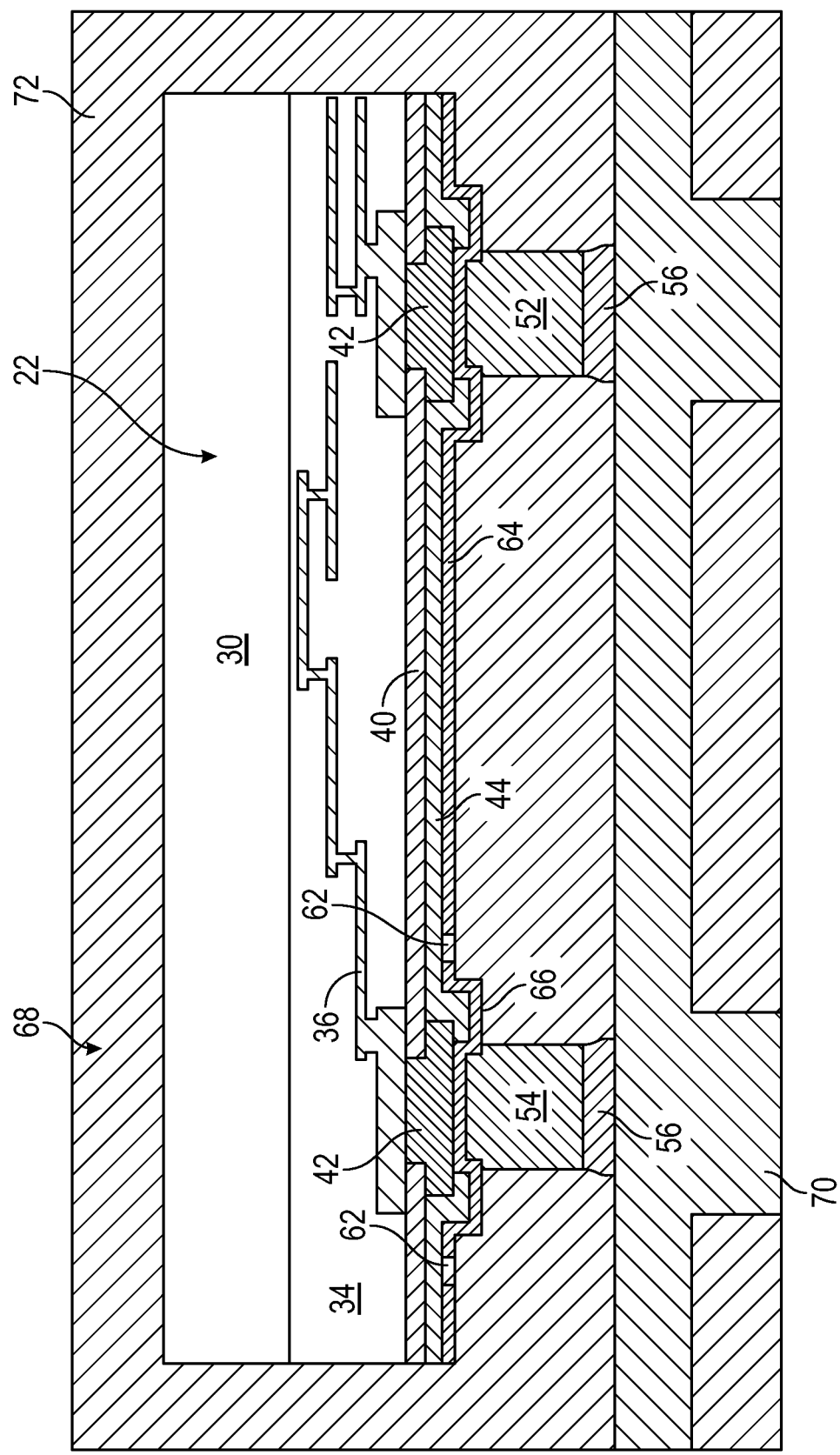
FIG. 11 is a simplified cross-sectional view of a microelectronic package into which the singulated plated pillar die shown in FIG. 10 may be incorporated in an example embodiment of the present disclosure.

Following singulation of semiconductor wafer 20, plated pillar die 22 (and the other plated pillar dies 24 produced pursuant to wafer singulation) may be mounted to and electrically interconnected with a second IC semiconductor die, a leadframe, a PCB, or another routed substrate. An example of one manner in which plated pillar die 22 may be incorporated into a leadframe-based, encapsulated package 68 is shown in FIG. 11. During package fabrication, plated pillar die 22 is inverted or flipped, placed in an appropriate location (e.g., utilizing a pick-and-place tool) such that solder caps 56 are brought into contact with a leadframe 70, and solder reflow is conducted to reflow soler caps 56 and form the solder joints providing the desired mechanical and electrical connections. As indicated in the illustrated example, microelectronic package 68 may then be encapsulated or overmolded as package fabrication completes; while, in other embodiments, this may not be the case. In further implementations, plated pillar die 22 may be mounted to a different routed substrate, such as a PCB; installed within a different type of microelectronic package (e.g., an air cavity package) or a module; or plated pillar die 22 may be mounted to another IC die in, for example, a stacked arrangement. In certain embodiments, the volume of space surrounding plated pillars 52, 54 may be filled with a dielectric material, such as an underfill material applied post mounting of plated pillar die 22. In other embodiments, this volume of space may be left as an unfilled air void, as may be more commonly practiced as the heights of plated pillars 52, 54 decrease. Regardless of the particular manner in which plated pillar die 22 is ultimately incorporated into a larger module, assembly, or system, plated pillar die 22 is rendered less susceptible or "hardened" to problematic EMI due to the presence of die-level EMI shield layer 64, which is beneficially grounded through ground contact pillars 54 during operation of plated pillar die 22 and the larger package, module, or system into which plated pillar die 22 is incorporated.

Progressing to FIG. 12, plated pillar die 22 is depcited from a top-down or planform perspective. In this view, the example distributions of ground contact pillars 52 and non-ground contact pillars 54 can be more clearly inferred; noting that, while pillars 52, 54 are hidden from view by solder caps 56, non-ground contact pillars 54 are surrounded by pillar skirt regions 66 and electrical isolation gaps 62. Here, it can also be seen that electrical isolation gaps 62 are each formed to have a substantially annular or ring-shaped planform geometry, with each isolation gap 62 and its corresponding non-ground contact pillar 54, as viewed along an axis orthogonal to EMI shield layer 64 (corresponding to the Z-axis of coordinate legend 38). This is not essential, however, providing that each isolation gap 62 (or perhaps a merged combination of isolation gaps 62) establishes the desired electrical isolation between non-ground contact pillars 54 and EMI shield layer 64. Accordingly, electrical isolation gaps 62 can be imparted with other geometries, including more complex geometries forming closed, polygonal shapes and merged shapes in which two or more electrical isolation gaps 62 intersect, providing that isolation gaps 62 provide the desired electrical isolation between non-ground contact pillars 54 and die-level EMI shield layer 64.

In the illustrated embodiment, die-level EMI shield layer 64 covers a majority, if not a vast majority or the substantial entirety of the frontside surface area of plated pillar die 22; e.g., in embodiments, EMI shield layer 64 may cover at least 90% or, perhaps, at least 95% of the frontside surface area of plated pillar die 22, as seen looking downwardly onto die 22 along an axis orthogonal to EMI shield layer 62 and parallel to the Z-axis of coordinate legend 38. Additionally, in embodiments, the completed plated pillar die 22 may include at least one region containing EMI-susceptible circuitry, as generally demarcated by a dashed rectangle 74 (hereafter, EMI-susceptible circuit region 74) in FIG. 12. Such an EMI-susceptible circuit region 74 may include, for example, integrated capacitors and inductors (as schematically represented in FIG. 12 by symbols 75 and 77, respectively) or other such circuit elements prone to performance detriments when exposed to sufficient EMI levels; e.g., in one embodiment, EMI-susceptible circuit region 74 may include an analog-to-digital converter clock tree. When including such EMI-sensitive circuit regions, and as indicated in the illustrated example, plated pillar die 22 may be fabricated such that EMI shield layer 64 overlies EMI-susceptible circuit region 74 in its entirety or substantial entirety; e.g., such that at least 95% and, perhaps, at least 99% of the surface area of the EMI-susceptible circuit 74 is covered or overlayed by EMI shield layer 64, again considered looking downwardly onto EMI shield layer 64 along an axis orthogonal to shield layer 64 and parallel to the Z-axis of coordinate legend 38. Also shown in a lower right detail bubble of this drawing figure is a schematic representation of a transistor 79, which maybe integrated into plated pillar die 22. Transistor 79 includes a control terminal 81 and two current-conducting terminals 83, 85, which are electrically separated by a variable-conductivity channel. In embodiments, transistor 79 may be a FET including a gate (control terminal 81), a drain (a first current-conducting terminal 83), and a source (a second current-conducting terminal 85). Further, in various implementations, and utilizing nomenclature typically applied to FETs in a non-limiting manner, the gate terminal of transistor 79 (and possibly other transistors integrated into plated pillar die 22) may be coupled to a first subset of the non-ground contact pillars 54, the drain terminal of transistor 79 may be electrically coupled to a second subset of non-ground contact pillars 54, and the source terminal of transistor 79 may be electrically coupled to ground contact pillars 52.

In the example embodiment of FIG. 12, plated pillar die 22 is further fabricated to include a seal ring structure 76 (also potentially referred to as a "crack stop" feature). Such a seal ring structure 76 may extend around an outer periphery of the frontside of plated pillar die 22 and perform either or both of two principal functions. First, such a seal ring structure 76, when energized, may reduce ionic contamination entering the die cavity during usage of plated pillar die 22. Second, seal ring structure 76 may serve as a crack stop feature decreasing the likelihood of crack formation and propagation during wafer singulation. To provide the ionic contamination keep-out function, seal ring structure 76 is usefully coupled to electrical ground, possibly through the first (M1) patterned metal layer included in frontside layers 32. In the context of plated pillar die architectures, however, establishing such additional metal routing of interconnect lines within frontside layers 32 can add undesired complexity to the overall routing scheme of plated pillar die 22. Consequently, an additional benefit can be realized in the context of plated pillar die 22 (and the other plated pillar dies 24 produced utilizing the presently-disclosed wafer processing methods) by forming EMI shield layer 64 to extend to and electrically contact seal ring structure 76 in at least some embodiments of the present disclosure. This may be appreciated more fully by reference to FIG. 13, which depicts, as a simplified, schematic illustration, an outer edge portion of plated pillar die 22 including seal ring structure 76 (shown prior to singulation of wafer 20, noting the inclusion of singulation regions 26). As can be seen, seal ring structure 76 includes an electrically-conductive ring layer 78, which extends around an upper periphery of plated pillar die 22 to provide the above-noted contamination protection and crack stop functions. Electrically-conductive ring layer 78 is further electrically tied to active regions 80 formed in die body 28 along with field isolation regions 82 through one or more bond pads 84 and via structures 86. Specifically, via structures 86 extend from bond pads 84 downwardly or inwardly through frontside layers 32 to active regions 80 to provide the desired electrical coupling.

Solder mask layer 44 partially encroaches onto the upper surface or frontside of electrically-conductive ring layer 78, but is patterned to include an opening through which the frontside of ring layer 78 is exposed. Metallic seed layer 46 (FIGS. 3-8) is deposited in contact with the exposed region or regions of electrically-conductive ring layer 78. EMI shield layer 64, when defined by patterning of metallic seed layer 46, remains electrically coupled to ring layer 78 through one or more regions 90 extending into the solder mask openings to contact the exposed frontside surface of ring layer 78. By virtue of this structural arrangement, plated pillars of the second pillar type (here, ground contact pillars 52 shown in FIGS. 5-11) are electrically coupled to the seal ring structure 76 through EMI shield layer 64. In terms of wafer processing, this may be described as, prior to singulation of semiconductor wafer 20, providing seal ring structures 76 extending around peripheral regions of non-singulated semiconductor dies 22, 24 and having exposed electrically-conductive regions 78; and depositing metallic seed layer 46 to contact the exposed electrically-conductive regions of seal ring structures 76. Thus, pursuant to the above-described electroplating process and removal of selected regions of metallic seed layer 46, plated pillars of the second pillar type (e.g., ground contact pillars 52) are electrically coupled to seal ring structures 76 through the wafer-level EMI shield layer. Following wafer singulation, singulated plated pillar dies 22, 24 are provided with direct, robust (high volume) electrical connections between ground contact pillars 52 and seal ring structures 76, while reducing the complexity of the routing plated pillar dies 52, 54.

There has thus been described an embodiment of a semiconductor wafer processing method for concurrently fabricating multiple plated pillar semiconductors having integrated, die-level EMI shield layers. Advantageously, embodiments of the wafer processing method leverage or repurpose the wafer-spanning metallic seed layer, as initially provided to support electroplating in plated pillar process flows, in forming a global or wafer-level EMI shield layer, which is subsequently separated into die-level EMI shield layers in conjunction with wafer singulation. In the above-described example wafer processing method, a conformal post-plating mask layer is utilized to support localized etching of the metallic seed layer and thereby produce electrical isolation gaps around a selected plated pillar type; e.g., non-ground contact pillars or non-$V_{ss}$ pillars in the context of FET-containing circuitry. In so doing, the metallic seed layer is effectively transformed into a grounded, EMI shield layer and a number of other electrically-isolated, non-grounded regions (e.g., the above-described pillar skirt regions) in embodiments. The foregoing example notwithstanding, a different technique may be utilized to pattern the metallic seed layer in further embodiments to define the electrical isolation gaps, the die-level EMI shield layers, and any other features desirably formed utilizing the non-sacrificial portion of the metallic seed layer. For example, in another potential process flow, the patterned electroplating mask itself may not be immediately stripped following the electroplating process, but rather retained, subject to further patterning, and then utilized in patterning the metallic seed layer and producing (among other features) the die-level EMI shield layers. Additional description in this regard will now be provided in connection with FIGS. 14 and 15.

Figure 14:
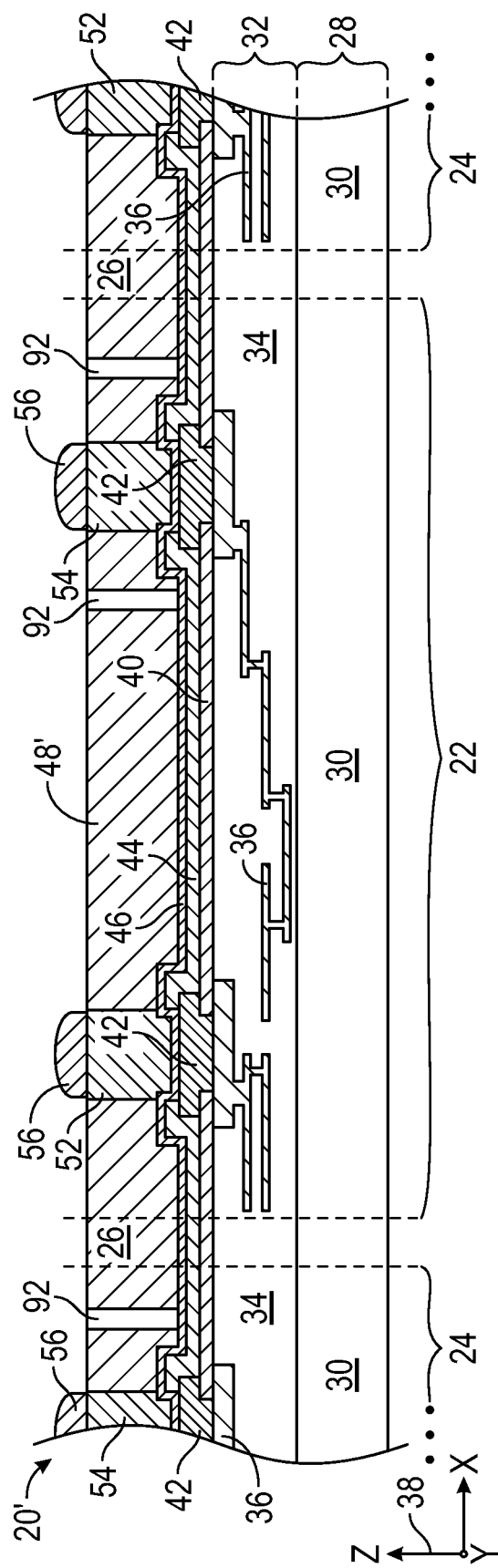
FIGS. 14 and 15 are simplified cross-sectional views of a semiconductor wafer (again, only a limited portion of which is shown) as depicted during certain processing stages performed to fabricate a number of plated pillar dies having die-level EMI shield layers, as illustrated in accordance with a second example manufacturing process flow of the present disclosure.
Figure 15:
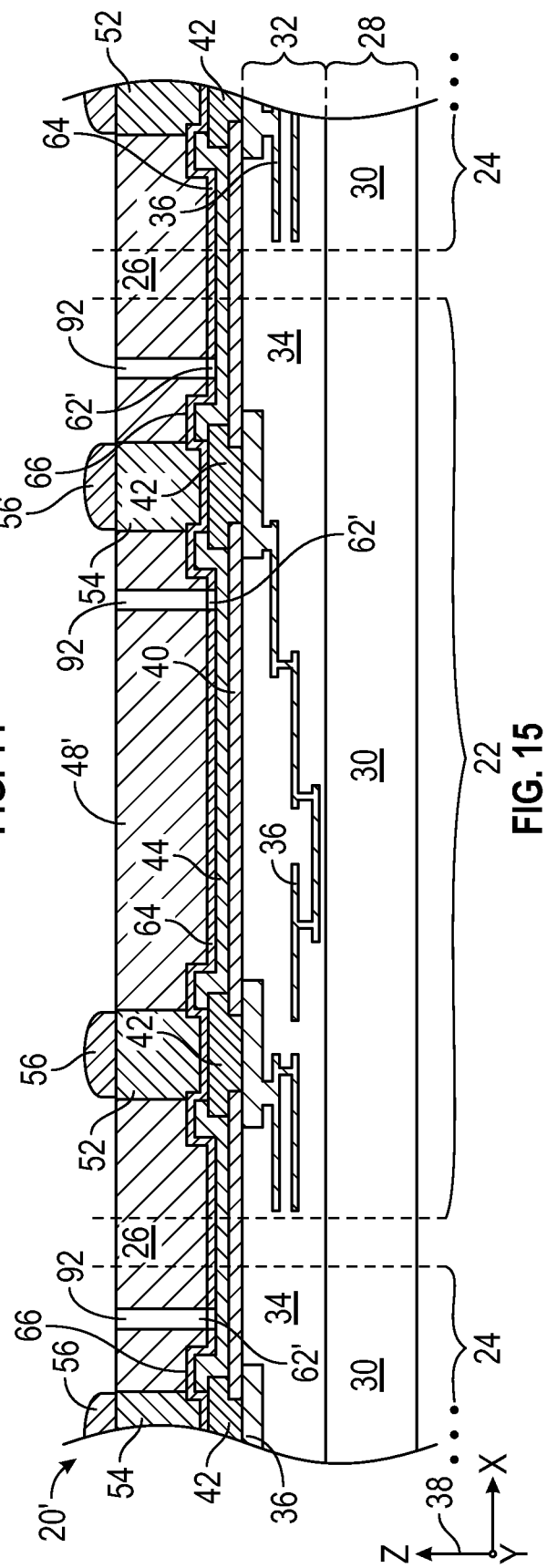

Referring lastly to FIGS. 14 and 15, a semiconductor wafer 20' (again, a limited portion of which is shown) is depicted during certain processing stages performed to fabricate a number of plated pillar dies 22, 24 having die-level EMI shield layers, as illustrated in accordance with a second example manufacturing process flow of the present disclosure. Semiconductor wafer 20' is substantially identical to semiconductor wafer 20 following the processing stage described above in connection with FIG. 5, with the following exception: electroplating mask layer 48' has been retained following electroplating and formation of plated pillars 52, 54. A prime symbol (') is appended to reference numeral "20" and to reference numeral "48" to indicate that, while these structures or structural elements are largely identical to wafer 20 and electroplating mask layer 48 described above in connection with FIGS. 1-5, a difference in process flow and structure arises when retaining mask 48' following electroplating for usage in patterning metallic seed layer 46 (as opposed to depositing a patterning a new, conformal mask layer for this purpose, as described above in connection with post-plating mask layer 58 shown in FIGS. 7 and 8).

As shown in FIG. 14, electroplating mask layer 48' subject to further patterning following the electroplating process and formation of plated pillars 52, 54 to define post-plating channels or openings 92 at selected locations in electroplating mask layer 48'. Post-plating openings 92 may be defined by a second exposure step and development, by laser patterning, or utilizing another technique to expose targeted regions of metallic seed layer 46. Afterwards, metallic seed layer 46 is etched or otherwise removed through post-plating openings 92 to remove the selected regions of metallic seed layer 46, produce electrical isolation gaps 62' around plated pillars of the first pillar type (here, non-ground contact or non-Vss pillars 54), and thereby convert a volumetric majority of metallic seed layer 46 to EMI shield layer 64, as shown in FIG. 15. From this point forward in the manufacturing process, electroplating mask layer 48' may be stripped and wafer processing may continue as described above in connection with FIGS. 9-12. Thus, additional processing steps may or may not be performed to form additional layers over EMI shield layer 64; and wafer singulation is ultimately carried-out to separate processed semiconductor wafer 20' into a plurality of discrete plated pillar dies each a die-level EMI shield layer, plated pillars of a first pillar type electrically isolated from the die-level EMI shield layer, and plated pillars of a second pillar type electrically coupled to the die-level EMI shield layer, as previously described.

CONCLUSION

There has thus been described plated pillar dies having integrated, die-level EMI shield layers, as well as methods for efficiently fabricating such plated pillar dies through wafer processing. Through the incorporation of die level EMI shield layers, the plated pillar dies are hardened to EMI, while retaining the thermal and electrical performance benefits afforded by plated pillar interfaces. In many instances, costs and tooling requirements associated with adapting the present teaching into existing manufacturing process flows are minimal due to the introduction of relatively few additional process steps and leveraging of the typically-sacrificial portions of the metallic seed layer (a relatively thin metal film) in forming the die-level EMI shield. Embodiments of the EMI shielding solutions presented herein provided other benefits, including the simplification of electrical routing schemes for providing direct, robust ground connections to seal ring structures when present within the plated pillar dies. Generally, then, embodiments of the present disclosure provide an EMI shielding overlay covering a majority, if not the substantial entirety (by surface area) of a plated pillar die, aside from regions in proximity of non-grounded pads or pillars. In various embodiments, the plated pillar die may assume the form of a Cu pillar bonded die having such an integrated or "on-die" EMI shield layer to prevent or at least substantially impede the penetration of electromagnetic radiation into the interior circuit-bearing regions of the plated pillar die, particularly any ADC clock tree regions or other such regions containing inductors, capacitors, or similar circuit elements prone to performance detriments in the presence of EMI.

Wafer processing techniques, or methods for forming semiconductor rides, are disclosed for fabricating plated pillar dies having die-level electromagnetic interference (EMI) shield layers. In embodiments, the method includes depositing a metallic seed layer over a semiconductor wafer and contacting die pads thereon. An electroplating process is then performed to compile plated pillars on the metallic seed layer and across the semiconductor wafer. Following electroplating, selected regions of the metallic seed layer are removed to produce electrical isolation gaps around a first pillar type, while leaving intact portions of the metallic seed layer to yield a wafer-level EMI shield layer. The semiconductor wafer is separated into singulated plated pillar dies, each including a die-level EMI shield layer and plated pillars of the first pillar type electrically isolated from the EMI shield layer. In certain cases, selected regions of the metallic seed layer removed (e.g., a volumetric majority of the metallic seed layer may be removed by etching) to produce electrical isolation gaps around the first pillar type, while selected portions of the metallic seed layer are left intact to yield the wafer-level EMI shield layer electrically coupled to a second pillar type included in the plated pillars. Further, the singulated plated pillar dies (as produced via singulation of the semiconductor wafer) may each include plated pillars of the second pillar type electrically coupled to the die-level EMI shield layer. In additional implementations, the first pillar type assumes the form of non-ground contact pillars, while the second pillar type assume the form of ground contact pillars. In such implementations, the step or process of removing may entail removing selected regions of the metallic seed layer to electrically isolate the non-ground contact pillars from the wafer-level EMI shield layer, while the ground contact pillars remain electrically connected to the wafer-level EMI shield layer.

Plated pillar dies having integrated, die-level EMI shield layers have also been provided. In implementations, a given plated pillar die includes a semiconductor-containing die body in which integrated circuitry is at least partly formed, a frontside layers formed over the die body including die pads electrically coupled to the integrated circuitry, and a metallic seed layer formed over the frontside layers. The metallic seed layer is patterned to define: (i) pad overlay regions in contact with the die pads; (ii) a die-level EMI shield layer extending to a first subset of the pad overlay regions; and (iii) electrical isolation gaps formed around a second subset of the pad overlay regions. Plated pillars of a first pillar type are electrically coupled to the integrated circuitry through the first subset of the pad overlay regions and electrically isolated from the die-level EMI shield layer by the electrical isolation gaps, while plated pillars of a second pillar type electrically coupled to the integrated circuitry and to the die-level EMI shield layer through the second subset of the pad overlay regions. In certain implementations, the integrated circuitry may include an EMI-susceptible circuit region containing integrated capacitors and inductors, such as an analog-to-digital converter clock tree. Further, in such embodiments, the die-level EMI shield layer may overlay and span the substantial entirety of the EMI-susceptible circuit region by surface area, as viewed along an axis orthogonal to the metallic seed layer. Additionally or alternatively, the plated pillar die may further include a seal ring structure extending around a peripheral region of the die body and the frontside layers, with the seal ring structure electrically coupled to the plated pillars of the second pillar type through the die-level EMI shield layer.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention, it being understood that various changes may be made in the function and arrangement of elements described in an example embodiment without departing from the scope of the invention as set forth in the appended claims. Numerical identifiers, such as "first," "second," "third," and the like have been used above in accordance with the order in which certain elements were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:

1. A method for forming semiconductor dies, the method comprising:
    depositing a metallic seed layer over a frontside of a semiconductor wafer containing non-singulated semiconductor dies, the metallic seed layer contacting die pads on the non-singulated semiconductor dies;
    performing an electroplating process to compile plated pillars on the metallic seed layer and distributed across the frontside of the semiconductor wafer;
    following the electroplating process, removing selected regions of the metallic seed layer to produce electrical isolation gaps around a first pillar type included in the plated pillars, while leaving intact selected portions of the metallic seed layer to yield a wafer-level electromagnetic interference (EMI) shield layer; and
    singulating the semiconductor wafer into singulated plated pillar dies each including a die-level EMI shield layer formed from a singulated piece of the wafer-level EMI shield layer and plated pillars of the first pillar type electrically isolated from the die-level EMI shield layer.

2. The method of claim 1, wherein removing comprises removing selected regions of the metallic seed layer to produce electrical isolation gaps around the first pillar type, while leaving intact selected portions of the metallic seed layer to yield the wafer-level EMI shield layer electrically coupled to a second pillar type included in the plated pillars; and
    wherein singulating comprises singulating semiconductor wafer into singulated plated pillar dies each including plated pillars of the second pillar type electrically coupled to the die-level EMI shield layer.

3. The method of claim 2, wherein the first pillar type comprises non-ground contact pillars, while the second pillar type comprises ground contact pillars; and
    wherein the removing comprises removing selected regions of the metallic seed layer to electrically isolate the non-ground contact pillars from the wafer-level EMI shield layer, while the ground contact pillars remain electrically connected to the wafer-level EMI shield layer.

4. The method of claim 2, further comprising, prior to singulation of the semiconductor wafer, providing seal ring structures extending around peripheral regions of the non-singulated semiconductor dies and electrically coupled to plated pillars of the second pillar type through the wafer-level EMI shield layer.

5. The method of claim 2, wherein the first pillar type included in the plated pillars comprises non-source pillars electrically coupled to non-source terminals of field effect transistors integrated into the singulated plated pillar dies;
    wherein the second pillar type included in the plated pillars comprises source pillars electrically coupled to source terminals and non-source pillars of the field effect transistors integrated into the singulated semiconductor dies; and
wherein the removing comprises removing selected regions of the metallic seed layer to electrically isolate the non-source pillars from the wafer-level EMI shield layer, while the source pillars remain electrically connected to the wafer-level EMI shield layer.

6. The method of claim 1, wherein removing comprises removing selected regions of the metallic seed layer to produce electrical isolation gaps around the first pillar type, while leaving intact a volumetric majority of the metallic seed layer to yield the wafer-level EMI shield layer.

7. The method claim 1, further comprising forming the plated pillars to be predominately composed of copper, by weight.

8. The method claim 1, further comprising forming at least a majority of the plated pillars at locations overlying the die pads, as taken along axes orthogonal to the metallic seed layer.

9. The method of claim 1, wherein depositing comprises depositing the metallic seed layer to a global average thickness at least ten times less than an average height of the plated pillars.

10. The method claim 1, further comprising producing at least a majority of the electrical isolation gaps to possess generally annular planform shapes substantially concentric with plated pillars of the first pillar type, as viewed along an axis orthogonal to the metallic seed layer.

11. The method of claim 1, wherein the singulated plated pillar dies each have a frontside surface area; and
wherein the method further comprises forming the wafer-level EMI shield layer such that, following singulation of the semiconductor wafer, the die-level EMI shield layers cover at least 90% of the frontside surface areas of the singulated plated pillar dies.

12. The method of claim 1, further comprising:
following the electroplating process and prior to removing selected regions of the metallic seed layer, depositing a conformal post-plating mask layer over the metallic seed layer and the plated pillars;
patterning the conformal post-plating mask layer to yield mask layer openings through which the selected regions of the metallic seed layer are exposed; and
etching the metallic seed layer through the mask layer openings to remove the selected regions of the metallic seed layer and produce electrical isolation gaps around plated pillars of the first pillar type.

13. The method of claim 1, further comprising:
following deposition of the metallic seed layer and prior to the electroplating process, forming a patterned electroplating mask layer over the metallic seed layer and having plating openings through which areas of the metallic seed layer are exposed; and
during the electroplating process, compiling the plated pillars in the plating openings of the patterned electroplating mask layer.

14. The method of claim 13, further comprising:
following the electroplating process and prior to removal of the patterned electroplating mask layer, forming post-plating openings in the patterned electroplating mask layer through which selected regions of the metallic seed layer are exposed; and
etching the metallic seed layer through the post-plating openings to remove the selected regions of the metallic seed layer and produce electrical isolation gaps around plated pillars of the first pillar type.

15. The method of claim 1, wherein the non-singulated semiconductor dies include EMI-susceptible circuit regions containing integrated capacitors and inductors; and
wherein the method further comprises forming the die-level EMI shields to overlie a substantial entirety of the EMI-susceptible circuit regions by surface area, as taken along axes orthogonal to the metallic seed layer.

* * * * *